United States Patent [19]

Glass et al.

[11] Patent Number: 5,323,022

[45] Date of Patent: Jun. 21, 1994

[54] PLATINUM OHMIC CONTACT TO P-TYPE SILICON CARBIDE

[75] Inventors: Robert C. Glass, Linkoping, Sweden; John W. Palmour, Cary, N.C.; Robert F. Davis, Raleigh, N.C.; Lisa S. Porter, Raleigh, N.C.

[73] Assignee: North Caroline State University, Raleigh, N.C.

[21] Appl. No.: 943,043

[22] Filed: Sep. 10, 1992

[51] Int. Cl.$^5$ .................... H01L 29/40; H01L 29/46; H01L 29/62

[52] U.S. Cl. .................. 257/77; 257/734; 257/744; 257/742; 257/743; 257/750; 257/768; 257/769; 437/100

[58] Field of Search ............. 257/734, 744, 750, 77, 257/768, 769; 437/100

[56] References Cited

U.S. PATENT DOCUMENTS

| | | | |
|---|---|---|---|
| 3,714,520 | 1/1973 | Engeler et al. | 317/234 R |
| 4,263,605 | 4/1981 | Christou et al. | 257/744 |
| 4,513,309 | 4/1985 | Cricchi | 357/42 |
| 4,583,110 | 4/1986 | Jackson et al. | 257/734 |
| 4,772,934 | 9/1988 | Cunningham et al. | 257/734 |
| 4,801,984 | 1/1989 | Woodall | 257/744 |
| 4,907,040 | 3/1990 | Kobayashi et al. | 357/4 |
| 4,966,862 | 10/1990 | Edmond | 437/100 |
| 5,006,914 | 4/1991 | Beetz et al. | 257/77 |
| 5,012,320 | 4/1991 | Yamazaki | 257/755 |
| 5,027,168 | 6/1991 | Edmond | 257/77 |
| 5,087,576 | 2/1992 | Edmond et al. | 437/22 |
| 5,098,859 | 3/1992 | Jackson et al. | 257/744 |
| 5,210,431 | 5/1993 | Kimoto et al. | 257/769 |

FOREIGN PATENT DOCUMENTS 2196421  3/1990  Japan .

OTHER PUBLICATIONS

N. A. Papanicolaou, A. Christou, M. L. Gipe, *Pt and PtSi$_x$ Schottky contacts on n-type β-SiC*, Journal of Applied Physics, vol. 65, No. 9, May 1989, pp. 3526–3530.

J. A. Edmond, et al., *Electrical Contacts to Beta Silicon Carbine Thin Films*, J. Electrochem. Soc., vol. 135, No. 2, Feb. 1988, pp. 359–362.

Y. A. Vodakov, et al., *Efficient green–emitting silicon carbide diodes*, Soviet Physics Semiconductors, vol. 26, No. 1, Jan. 1992, pp. 59–61.

S. M. Sze, Physics of Semiconductor Devices, Second Edition (1981), John Wiley & Sons, Pub., pp. 294–297.

R. C. Glass, L. M. Spellman, R. F. Davis, *Low Energy Ion–Assisted Deposition of Titanium Nitride Ohmic Contacts on Alpha (6H)–Silicon Carbide*, Appl. Phys. Lett. 59 (22), Nov. 25, 1991, pp. 2868–2870.

V. M. Bermudez and R. Kaplan, *Investigation of the Structure and Stability of the Pt/SiC(001) Interface*, J. Mater. Res., vol. 5, No. 12, Dec. 1990, pp. 2882–2893.

(List continued on next page.)

*Primary Examiner*—Jerome Jackson
*Assistant Examiner*—Alice W. Tang
*Attorney, Agent, or Firm*—Bell, Seltzer, Park & Gibson

[57] ABSTRACT

A method and resulting ohmic contact structure between a high work function metal and a wide bandgap semiconductor for which the work function of the metal would ordinarily be insufficient to form an ohmic contact between the metal and the semiconductor. The structure can withstand annealing while retaining ohmic characteristics. The ohmic contact structure comprises a portion of single crystal wide bandgap semiconductor material; a contact formed of a high work function metal on the semiconductor portion; and a layer of doped p-type semiconductor material between the single crystal portion and the metal contact. The doped layer has a sufficient concentration of p-type dopant to provide ohmic behavior between the metal and the semiconductor material.

14 Claims, 4 Drawing Sheets

OTHER PUBLICATIONS

J. Pelletier, et al., *Application of Wide-Gap Semiconductors to Surface Ionization: Work Functions of AlN and SiC Single Crystals*, J. Appl. Phys. 55(4), Feb. 15, 1984, pp. 994–1002.

K. Das, et al., *Deep-Level Dominated Electrical Characteristics of Au Contacts on β-Sic*, J. Electrochem. Soc., vol. 137, No. 5, May 1990, pp. 1598–1603.

Alfred B. Anderson and Ch. Ravimohan, *Bonding of α-SiC Basal Planes to Close-Packed Ti, Cu, and Pt Surfaces: Molecular-Orbital Theory*, J. Am. Phys. Society, vol. 38, No. 2, Jul. 15, 1988, pp. 974–977.

J. M. Andrews, *The Role of the Metal-SEmiconductor Interface in Silicon Integrated Circuit Technology*. J. Vac. Sci. Technol., vol 11, No. 6, Nov./Dec. 1974, pp. 972–984.

J. M. Andrews and J. C. Phillips, *Chemical Bonding and Structure of Metal–Semiconductor Interfaces*, Physical Review Letters, vol. 35, No. 1, Jul. 7, 1975, pp. 56–59.

T. C. Chou, *Anomalous Solid State Reaction Between SiC and Pt*, J. Mater. Res., vol. 5, No. 3, Mar. 1990, pp. 601–608.

J. L. Freeouf, *Silicide Interface Stoichiometry*, J. Vac. Sci. Technol., 18(3), Apr. 1991, pp. 910–916.

S. Kurtin, T. C. McGill, and C. A. Mead, *Fundamental Transition in the Electronic Nature of Soilds*, Physical Review Letters, vol. 22, No. 26, Jun. 30, 1969, pp. 1433–1436.

E. D. Marshall, et al., *Pt and Pd Silicides and Pd Germanide as Contact Metallizations for GaAs*, Mat. res. Soc. Symp. Proc., vol. 25 (1984), pp. 63–68.

M. A. Sobolewski and C. R. Helms, *Studies of Barrier Height Mechanisms in Metal–Silicon Nitride–Silicon Schottky Barrier Diodes*, J. Vac. Sci. Technol. B., vol. 7, No. 4, Jul./Aug. 1989, pp. 971–979.

L. M. Spellman et al., *Heteroepitaxial Growth and Characterization of Titanium Films on Alpha (6H) Silicon Carbide*, Mat. Res. Soc. Symp. Proc., vol. 221, 1991, pp. 99–104.

Leonard J. Brillson, *Chemical Mechanisms of Schottky Barrier Formation*, J. Vac. Sci. Technol., 16(5), Sep.-/Oct. 1979, pp. 1137–1142.

PLATINUM OHMIC CONTACT TO P-TYPE SILICON CARBIDE

FIELD OF THE INVENTION

The present invention is a method of successfully forming ohmic contacts to p-type wide bandgap semiconductor materials using high work function metals, as well as the resulting ohmic contact structures. In a particular embodiment, the invention is a method for forming platinum ohmic contacts on silicon carbide and the resulting ohmic contact structures.

BACKGROUND OF THE INVENTION

In typical applications, semiconductor devices are operated by, and are used to control, the flow of electric current within specific circuits to accomplish particular tasks. Accordingly, because of their high conductivity, the most useful and convenient materials for carrying current from device to device are metals.

In order to connect devices into useful circuits, appropriate contacts must be made between semiconductor devices and the metals—e.g. printed circuits, wires, or any other appropriate metal elements—used to carry current. Often, the most appropriate contacts are also formed of metal. Such metal contacts should interfere either minimally or preferably not at all with the operation of either the device or the current carrying metal. The contact must also be physically and chemically compatible with the semiconductor material.

In this regard, the term "ohmic contact" is used to define such an appropriate metal-semiconductor contact. Specifically, an ohmic contact can be defined as a metal-semiconductor contact that has a negligible contact resistance relative to the bulk or spreading resistance of the semiconductor, Sze, *Physics of Semiconductor Devices*, Second Edition, 1981, page 304. As further stated therein, an appropriate ohmic contact will not significantly change the performance of the device to which it is attached, and it can supply any required current with a voltage drop that is appropriately small compared with the drop across the active region of the device.

An ohmic contact can also be qualified using other characteristics of both a metal and a semiconductor. In most cases, and in addition to the other necessary physical and chemical characteristics, in order to act as an ohmic contact to a particular p-type semiconductor, the metal must have a work function greater than the work function of the semiconductor. Ideally, the work function of the metal should be greater than the electron affinity and the bandgap of the semiconductor.

As known to those familiar with this art and this terminology, the work function is defined in terms of the Fermi energy of the material. In turn, the Fermi energy of a material is the effective average energy of the electrons in thermal equilibrium with the surroundings of the material. Alternatively, the Fermi energy can be defined as the energy at which half the available states are on the average actually populated with electrons at thermal equilibrium. The work function of the material is the energy required to remove an electron having the Fermi energy from the material to an infinite distance away from the material.

Summarized somewhat differently, if the work function of the metal is greater than that of the p-type semiconductor, it may qualify as an ohmic contact material to that p-type semiconductor. If, however, the work function of the semiconductor is greater than that of the metal, it will be difficult or impossible to establish ohmic behavior and rectifying behavior may be demonstrated instead.

One material for which great semiconductor potential has long been recognized is silicon carbide (SiC). Silicon carbide has well known advantageous semiconductor characteristics: a wide bandgap, a high thermal conductivity, a high melting point, a high electric field breakdown strength, a low dielectric constant, and a high saturated electron drift velocity. Taken together, these qualities potentially give electronic devices formed from silicon carbide the capability to operate at higher temperatures, higher device densities, higher speeds, higher power levels, and even under higher radiation densities, as compared to other semiconductor materials. Accordingly, attempts to produce appropriate devices from silicon carbide, as well as attempts to produce device quality silicon carbide itself, have been of interest to scientists and engineers for several decades. As stated above, one aspect of device manufacture in any semiconductor material, and specifically including silicon carbide, is the ability to produce appropriate ohmic contacts.

When used as a semiconductor material, particularly p-type, silicon carbide presents special challenges with respect to ohmic contacts because of its relatively large bandgap which results in a relatively large work function as well. For example, in the ideal case, disregarding any effects of band bending caused by Fermi level pinning, p-type alpha (6H) silicon carbide has a work function ranging from about 5.7 to 7.2 electron volts (eV) depending upon the carrier concentration. For those well skilled in the art, the work function is defined as the sum of the electron affinity plus the energy level between the conduction band and the Fermi level. As a result, finding metals with a work function greater than that of silicon carbide has to date proved difficult and troublesome. The same problems hold true for other wide bandgap semiconductor materials such as zinc selenide (ZnSe), gallium nitride (GaN), diamond, boron nitride (BN), gallium phosphide (GaP), and aluminum nitride (AlN).

As a result, ohmic contacts to p-type silicon carbide are generally formed of alloys such as aluminum-titanium and aluminum-silicon which have to be annealed at relatively high temperatures (e.g. 900° C.) in order to form an appropriate ohmic contact. As known to those familiar with such devices, the repeated exposure of a device to such high temperatures will eventually generally change its character. Furthermore, the presence of aluminum or aluminum alloys on silicon carbide-based semiconductor devices limits the later treatment or processing of such devices because of the limitations of the physical and chemical properties of the alloys and the alloying metals, particularly their somewhat lower melting points.

Platinum (Pt), because of its characteristics as a noble metal, is a desirable candidate for ohmic contacts to all sorts of semiconductor materials. Unfortunately, and with respect to the parameters discussed earlier, the work function of platinum is 5.65 eV; i.e. generally about 0.6 eV less than that of p-type 6H silicon carbide. Thus, approached from a bandgap theory, platinum should not provide an ohmic contact to silicon carbide.

Therefore, the need exists for ohmic contacts to p-type silicon carbide that can use metals more preferable than those presently most commonly incorporated. There is a further need for a contact that does not require high temperature annealing in order to perform as an ohmic contact, and for an ohmic contact which maintains its ohmic character after any necessary or desired subsequent annealing of the device or silicon carbide.

OBJECT AND SUMMARY OF THE INVENTION

It is an object of the present invention to provide a p-type ohmic contact structure and a method of forming it between high work function metals such as platinum and wide bandgap semiconductors such as silicon carbide for which the work function of the metal would ordinarily be insufficient to form an ohmic contact between the metal and the p-type semiconductor and wherein the structure can withstand annealing while retaining ohmic characteristics. The invention meets this object with an ohmic contact structure formed of a portion of single crystal wide bandgap semiconductor material such as silicon carbide, a contact formed of a high work function metal on the semiconductor portion, and a layer of doped p-type semiconductor material between the single crystal portion and the metal contact in which the doped layer has a sufficient concentration of p-type dopant to provide ohmic behavior between the metal and the semiconductor material.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

The present invention is an ohmic contact structure between a high work function metal and a p-type wide bandgap semiconductor for which the work function of the metal would ordinarily be insufficient to form an ohmic contact between the metal and the semiconductor, and wherein the structure can withstand annealing while retaining ohmic characteristics. The ohmic contact structure comprises a portion of single crystal wide bandgap p-type semiconductor material, a contact formed of a high work function metal on the semiconductor portion, and a layer of doped p-type semiconductor material between the single crystal portion and the metal contact. The doped layer has sufficient concentration of p-type dopant to provide ohmic behavior between the metal and the semiconductor material.

It will be understood by those familiar with wide bandgap semiconductors such as silicon carbide and semiconductor devices formed therefrom that the invention is most useful in making an ohmic contact to p-type silicon carbide, as the doping technique described herein, if used to implant p-type dopants into n-type SiC, would produce a p-n junction rather than an ohmic contact to p-type SiC.

As noted herein, in the preferred embodiment, the wide bandgap semiconductor material comprises silicon carbide, but can also be selected from the group consisting of zinc selenide (ZnSe), gallium nitride (GaN), diamond, boron nitride (BN), gallium phosphide (GaP), and aluminum nitride (AlN).

Further to the preferred embodiments, the high work function material preferably comprises platinum, but can also be selected from the group consisting of platinum silicide ($Pt_xSi_{1-x}$, where x is an integer to form various combinations of platinum and silicon), gold (Au), nickel (Ni), palladium (Pd), silver (Ag), chromium (Cr), and tungsten (W). As these metals demonstrate, the high work function metal is often a low reactivity or noble metal.

Although the inventors do not wish to be bound by any particular theory, it appears most likely that the doped layer must include a sufficient concentration of p-type dopant to reduce the width of the depletion region sufficiently at the interface between the metal contact and the semiconductor material to allow carrier tunneling transport across the interface. As will be understood by those familiar with such devices, a depletion region is established between a metal and a semiconductor material when the metal has a work function that would ordinarily cause it to have rectifying characteristics rather than ohmic characteristics with respect to that particular semiconductor.

"Tunneling" refers to a quantum mechanical process, well-understood by those familiar with this art, in which a carrier makes a transition through or across an energy barrier in a manner forbidden by classical mechanics.

In selecting a combination of wide bandgap semiconductor material and high work function metal, the high work function metal is preferably selected to have: the thermal chemical potential to form compounds with the semiconductor material; diffusional stability with the semiconductor material; the ability to form solid solutions with the semiconductor material; and stability against environmental degradation.

Figure 1:
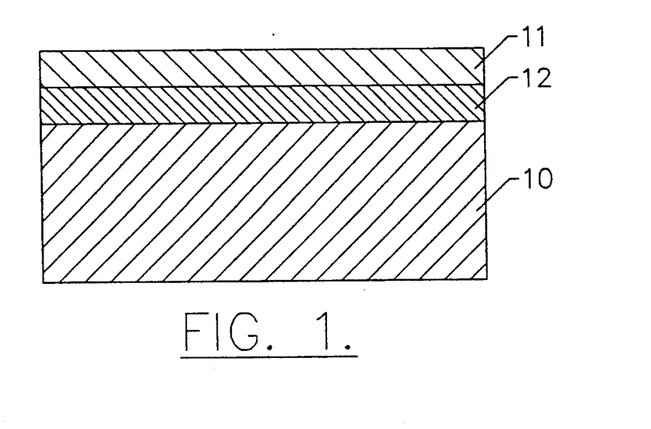
FIG. 1 is a schematic cross-sectional diagram of an ohmic contact structure according to the present invention.

The most preferred embodiment of the present invention is illustrated in FIG. 1 which comprises an ohmic contact structure between platinum and silicon carbide and that can withstand annealing while retaining ohmic characteristics. The ohmic contact structure first comprises a portion of single crystal silicon carbide 10. The portion 10 can comprise a bulk crystal or an epitaxial layer. The silicon carbide is preferably selected of the group consisting of the 3C, 2H, 4H, 6H, 8H, and 15R polytypes, and is most preferably the 6H polytype.

A platinum contact 11 is on the silicon carbide portion 10. As further illustrated in FIG. 1, a layer 12 of doped p-type silicon carbide is between the single crystal portion 10 and the platinum contact 11, with the doped layer 12 having a sufficient concentration of p-type dopant to provide ohmic behavior between the silicon carbide portion 10 and the platinum contact 11.

Preferably, the doped layer 12 has a sufficient concentration of p-type dopant to reduce the width of the depletion region sufficiently at the interface between the platinum contact 11 and the doped layer 12 to allow carrier (electron) tunneling transport across the interface.

In preferred embodiments, the doped layer 12 comprises an implanted region of the single crystal portion 10. The implantation is carried out consistently with the high temperature ion implantation set forth in U.S. Pat. No. 5,087,576 to Edmond et al. for "High Temperature Implantation of Silicon Carbide" which is incorporated entirely herein by reference. Alternatively, the doped layer 12 can comprise an epitaxial layer should the use of such a layer be more advantageous or convenient than the ion implantation technique.

The preferred dopant for the p-type layer 12 is aluminum, although boron is also acceptable. The concentrations should be at least $1 \times 10^{17}$ cm$^{-3}$, with concentrations of at least about $5 \times 10^{18}$ cm$^{-3}$ preferred, and concentrations of at least $1 \times 10^{19}$ cm$^{-3}$ most preferred.

The doped p-type layer has an actual thickness of at least 50 angstroms (Å) and preferably more than 100 Å.

Again, although the inventors do not wish to be bound by any particular theory, it appears useful for the platinum contact 11 to have formed a platinum silicide composition between the doped p-type layer 12 and the platinum contact 11 in order to obtain the ohmic behavior of the present invention.

Thus, in another embodiment, the invention comprises the method of forming an ohmic contact between a wide bandgap p-type semiconductor material and a high work function metal to produce an ohmic contact that can withstand annealing. In this embodiment, the invention comprises forming a layer of doped wide bandgap semiconductor material on a single crystal portion of the same semiconductor material in which the doped layer has a sufficient concentration of p-type dopant to provide ohmic behavior between the semiconductor material and the high work function material. A layer of the metal is then deposited on the doped layer of the semiconductor material to provide the ohmic contact to the semiconductor material.

In a preferred embodiment, the step of forming the doped layer comprises forming a layer of doped silicon carbide on a portion of single crystal silicon carbide and then depositing a layer of platinum on the doped layer to provide an ohmic contact to the silicon carbide.

As set forth with respect to the structure, the preferred polytype of silicon carbide is the 6H polytype, although the silicon carbide can also be selected from the group consisting of the 3C, 2H, 4H, 6H, 8H, and 15R polytypes.

The step of forming the layer of doped silicon carbide most preferably comprises forming a layer doped with a sufficient concentration of p-type dopant to reduce the width of the depletion region sufficiently at the interface between the platinum contact and the silicon carbide portion to allow carrier tunneling transport across the interface. As noted with respect to the structure, the doped p-type layer has a carrier concentration of at least about $1 \times 10^{17}$ cm$^{-3}$, more preferably $5 \times 10^{-3}$, and most preferably at least $1 \times 10^{19}$ cm$^{-3}$.

Both aluminum and boron can be used as dopants, and in certain embodiments, it is preferable to include aluminum on an atomic percentage basis of between about 0.1 and 5%.

One of the advantages of the invention is that the platinum does not need to be annealed to the silicon carbide in order to form the ohmic contact structure. If desired, however, the contact structure can be annealed without destroying its ohmic character. Thus, the flexibility offered by the present invention offers significant advantages in device design and manufacture.

With respect to annealing, there are two potential annealing steps that can be used in the method of the present invention. The first is the annealing of the heavily doped layer following ion implantation, and the other is the optional annealing of the metal contact after it has been deposited.

As another advantage, when the doping of the layer is accomplished through ion implantation, the step of forming the doped silicon carbide layer can either precede or follow the step of depositing the platinum.

In carrying out ion implantation, and as set forth in the experimental section herein, the step of high temperature ion implantation preferably comprises implanting with an energy of about 10 kilovolts (kv), a dose of about $6 \times 10^{15}$ cm$^{-2}$, with the silicon carbide maintained at about 600° C., a peak concentration of $5 \times 10^{-3}$, and to a depth of about 100 Å.

As alluded to earlier, the ion implanted layer can be annealed prior to the step of depositing the layer of platinum and such an anneal can be carried out at temperatures of at least about 1000° C.

Furthermore, the ohmic contact structure can be annealed following the step of depositing the layer of platinum, either before or after ion implantation. The annealing of the platinum is generally carried out at a temperature of at least about 400° C., and preferably as high as 900° C.

When the platinum is annealed, it appears that it is most advantageous to anneal the platinum to form platinum silicide. Alternatively, the step of depositing a layer of platinum can comprise the step of depositing a layer of platinum silicide which can be done by any appropriate technique including direct deposition, sputter deposition, or any other appropriate technique.

In yet another embodiment, the invention comprises an active semiconductor device which comprises a silicon carbide active portion, a platinum contact to the active portion, and a layer of doped p-type silicon carbide between the silicon carbide active portion and the platinum contact. The doped layer has a sufficient concentration of p-type dopant to provide ohmic behavior between the silicon carbide active portion and the platinum contact. Any such semiconductor device would include at least the structure shown in FIG. 1 and as described in the specification with respect to FIG. 1. Typical devices could include a junction diode, a bipolar junction transistor, a capacitor, a light emitting diode, a photodetector, a field effect transistor (MOSFET, JFET, or MESFET), and devices such as thyristors, IMPATT diodes, resistors and sensors.

EXPERIMENTAL

The Pt films were deposited on the Si (0001) face of single crystal, p-type α(6H)-SiC epilayers grown on n-type substrates. Depositions were conducted on Al implanted (10 keV, $6 \times 10^{15}$ cm$^2$ or 50 keV, $2 \times 10^{16}$ cm$^2$ dosages at approximately 600° C.), doped (approximately $10^{17}$ cm$^{-3}$) epilayers. The implanted samples were annealed in vacuum at 1500° C. prior to metallization. Carrier concentrations of these samples were difficult to obtain, however, due to the high doping levels. Prior to metallization, all of the substrates were precleaned in 10% hydrofluoric acid to remove the native oxide. Upon entry into the vacuum chamber, the substrates were thermally desorbed over a resistive graphite heater for 15 minutes at 700° C. to remove hydrocarbon contaminants on the surface.

Deposition was conducted n an ultra-high vacuum (UHV) electron beam evaporation system, which is discussed in detail along with the experimental procedures in Glass et al., "Low Energy Ion Assisted Deposition of Titanium Nitride Ohmic Contacts on Alpha (6H) Silicon Carbide," *Applied Physics Letters*, Vol. 59(22), pages 2868-2870 (1991); and Glass "Interface Chemistry and Structure Resulting From Low Energy Ion Assisted Deposition of Titanium Nitride on Ceramic Substrates", Thesis, N.C. State University, Raleigh, N.C. (1991). Base pressures were approximately $1-2\times10^{-10}$ torr, and deposition pressures were approximately $8\times10^{-8}$ torr. Approximately 1000 Å of Pt was deposited at an evaporation rate of 10 Å/min., with substrate rotation. The wafers were one inch (1") in diameter.

To produce contacts for current-voltage (I-V) measurements, the Pt was deposited through a molybdenum shadow mask containing 0.76 and 0.50 mm diameter contact pads. One half of the one inch wafer was unmasked to provide a large area contact for the surface-to-surface I-V measurements. Electrical measurements were conducted on the as-deposited contacts and on those successively annealed from 450° to 850° C. in 100° increments under UHV. Measurements were conducted ex-situ. on a Rucker-Kolls electrical probe station. All I-V curves were taken between the smallest diameter pads and the unmasked region. To study the reaction interface, Auger spectroscopy (AES) was performed as a function of depth on separate as-deposited and annealed samples with a JEOL JAMP-30.

Figure 2:
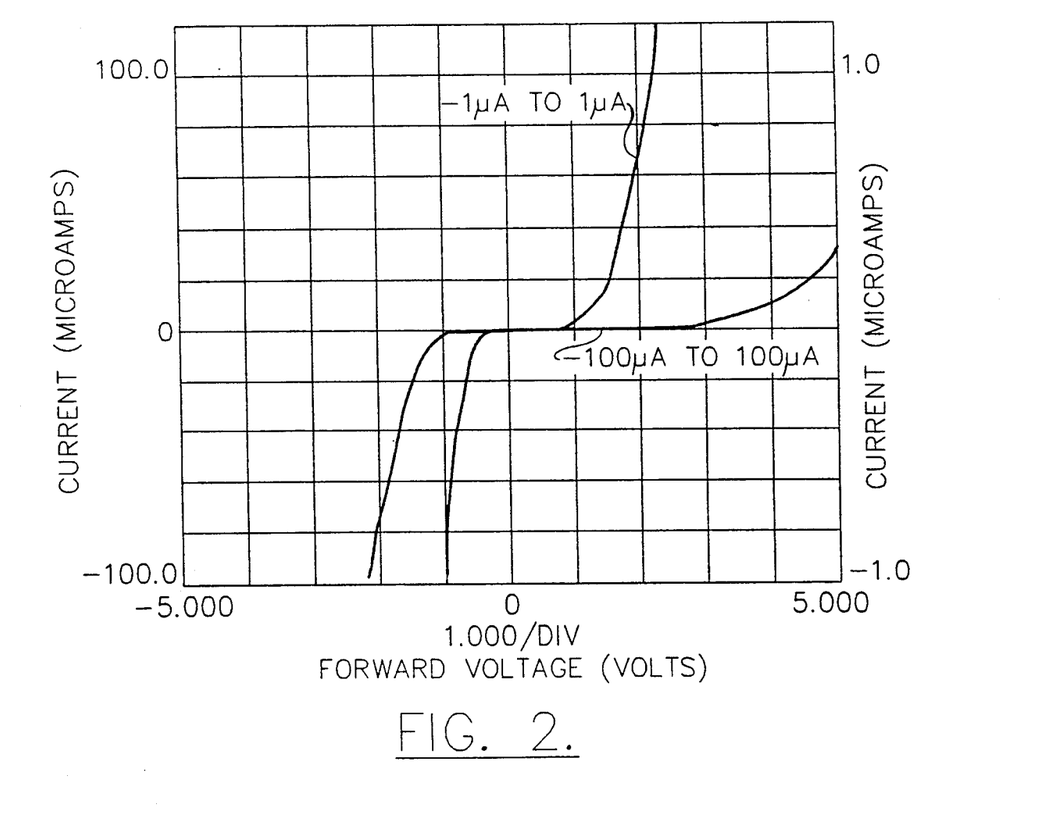
FIG. 2 is a current-voltage (I-V) plot of conventional platinum contacts on p-type silicon carbide structures which display rectifying characteristics rather than ohmic characteristics.
Figure 3:
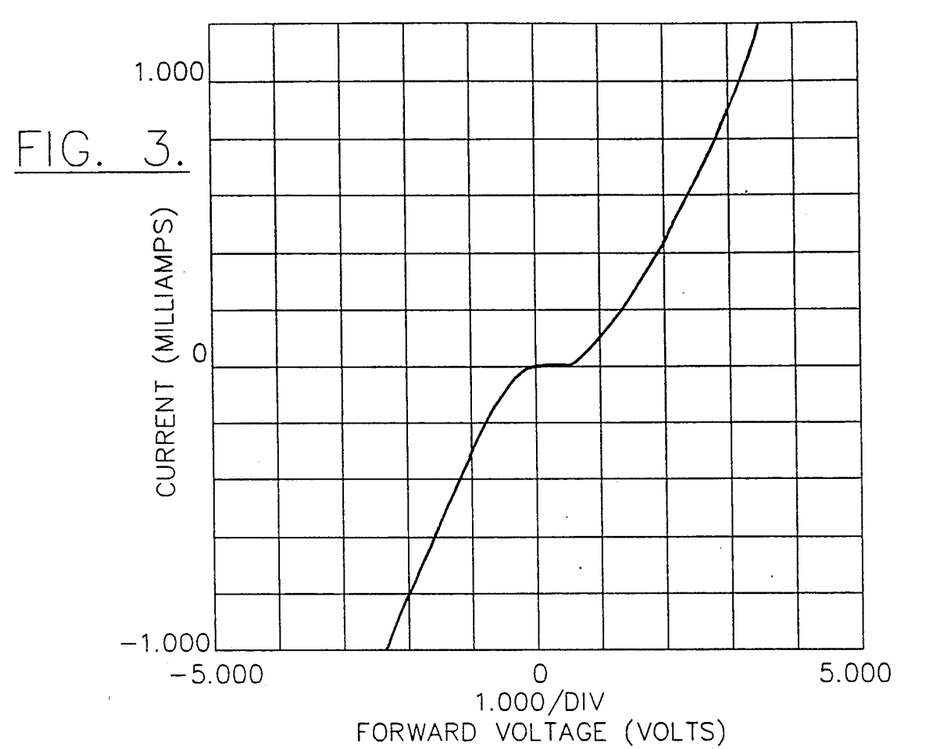
FIG. 3 is a plot similar to FIG. 2, but with the conventional contact having been annealed in an attempt to approach ohmic contact behavior absent the use of the present invention.

FIG. 2 displays the room temperature linear-linear I-V plots of as-deposited Pt contacts on SiC samples grown with p-type dopant concentrations of $2\times10^{18}$ cm$^{-3}$. FIG. 3 displays the same for the annealed contacts. These contacts displayed rectifying characteristics, with a soft breakdown beginning at approximately 1 volt, with a leakage current of 0.5 $\mu$A/mm$^2$ at 2 V. After the 550° C. anneal, the linear-linear plot indicates a decrease in forward resistance. After the 650° C. anneal, the linear-linear I-V curves develop close to linear character in the forward and reverse bias direction. After the 750° C. anneal and higher, the log-log curves are the most linear, with a short and low sloped SCL region. It was, however, not possible to entirely remove this region, despite better than 950° C. anneals.

Figure 4:
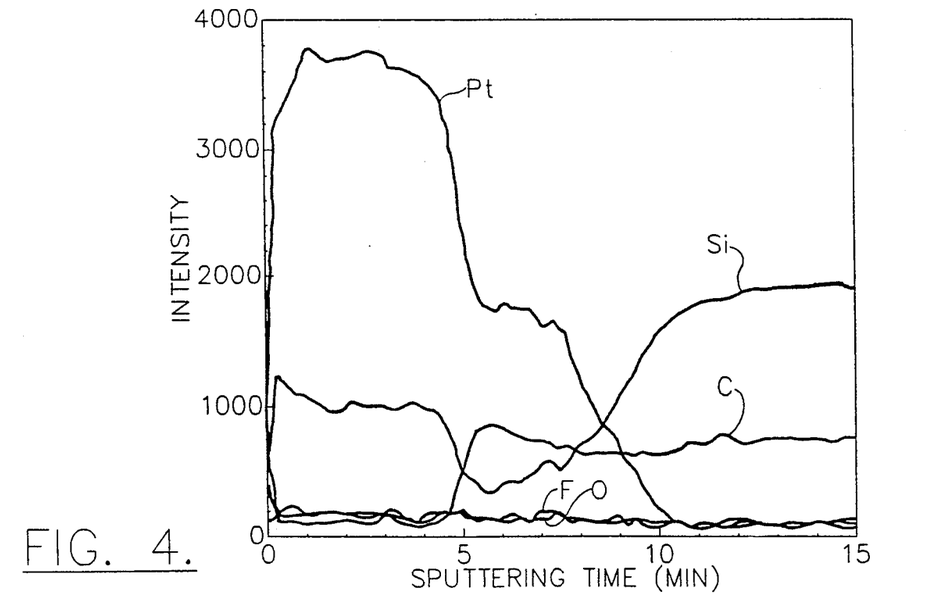
FIG. 4 is a chemical profile versus depth plot of an ohmic contact structure according to the present invention.
Figure 7:
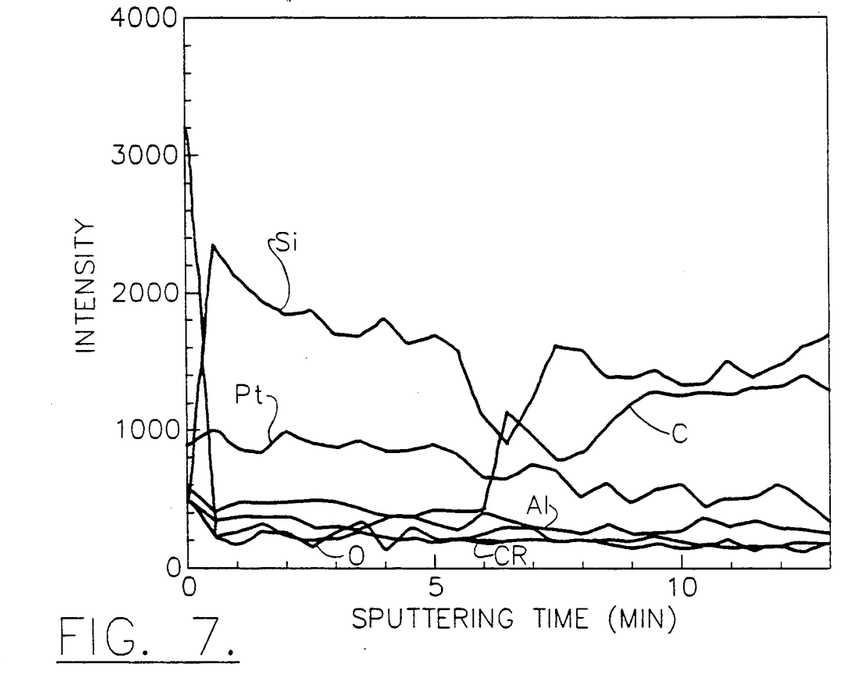
FIG. 7 is another chemical profile versus depth plot of an ohmic contact structure according to the present invention.

Chemical analysis of the annealed films confirmed the data provided in the studies by Chou, "Anomalous Solid State Reaction Between SiC and Pt"; *Journal of Materials Research*, Vol. 5(3), pages 601-08 (1990); and Bermudez, et al., "Investigation of the Structure and Stability of the Pt/SiC (001) Interface", *Journal of Materials Research*, Vol. 5(12), pages 2882-2893 (1990). Chemical profile versus depth for an ohmic contact according to the invention is shown in FIG. 4. This data, in addition to chemical mapping, indicated that carbon (C) was uniformly distributed throughout the interface and surrounding regions, while the silicon (Si) had diffused to the surface and segregated into islands within the Pt film. Specifically, FIG. 4 is an Auger profile of Pt on a non-implanted sample and FIG. 7 is an Auger profile of an implanted sample. The profiles are exemplary of the difusional behavior of the contact with and without the implant.

The salient point is that although the contact I-V characteristics of conventional Pt-SiC contacts did become mostly linear as the anneal took place, they never were completely indicative of ohms law character near the origin. This was interpreted to indicate a small barrier between the reacted film and the SiC substrate.

THE INVENTION

Figure 5:
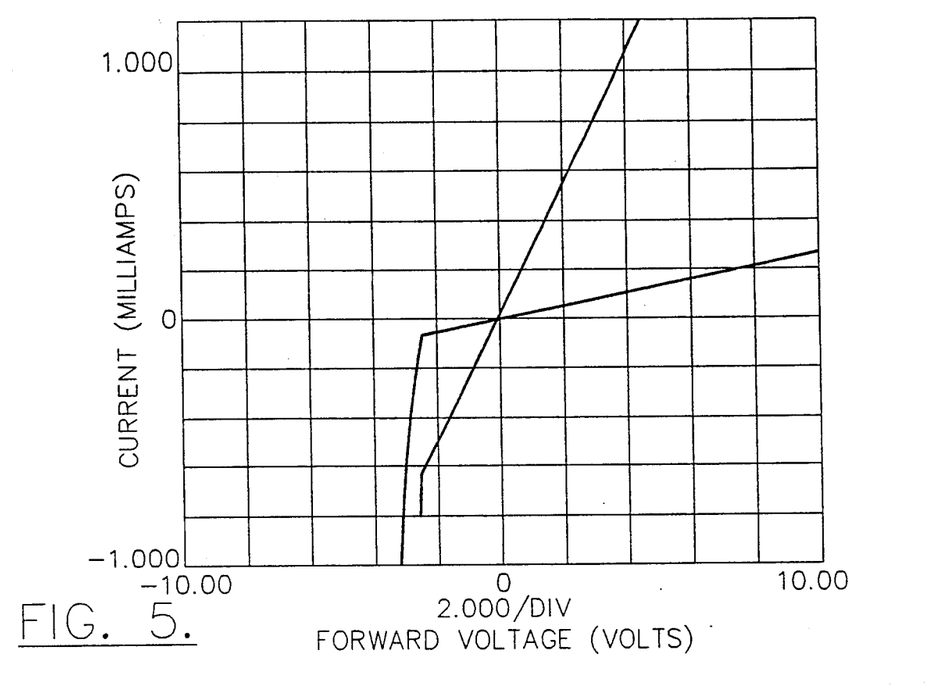
FIG. 5 is a current voltage plot of an ohmic contact structure according to the present invention.
Figure 6:
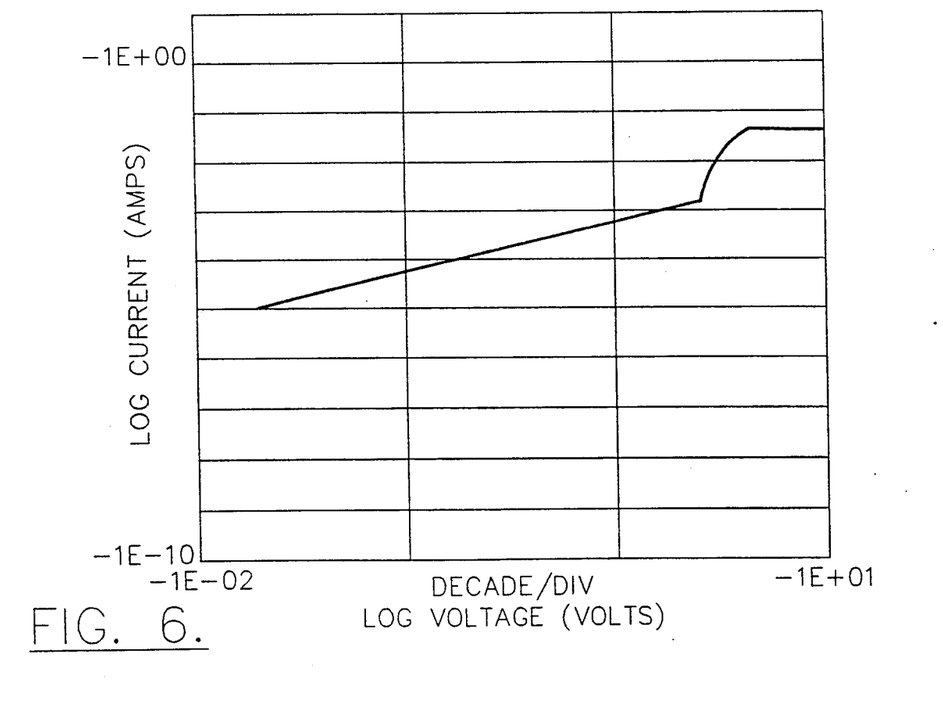
FIG. 6 is a logarithmic plot of current versus voltage for ohmic contact structures according to the present invention and demonstrating their ohmic character.

FIG. 5 shows the linear I-V characteristics of an ohmic contact structure according to the present invention; a Pt contact to a SiC substrate implanted with 10 keV Al+ions at a dosage of $6\times10^{15}$/cm$^2$. This curve was typical of the as-deposited contact, and changed little after annealing up to 850° C. The log-log plot of these contacts (FIG. 6) is a straight line with slopes of unity. This indicates the ohmic character.

It is not clear at this time why I-V curves from the Pt contacts to the non-implanted substrates were non-linear through the origin. Due to the extensive intermixing seen in the depth profiles of FIG. 4, it is difficult to apply theoretical interface models to this work. It is clear, however, that the implantation and annealing processes promote the ohmic properties regardless of the anneal state of the contact. This in turn indicates that the formation of a degenerate (p+) region is probable although further testing with other metals may be required to confirm this.

In summary, an ohmic contact has been produced using Pt deposited via electron beam evaporation onto a p+Si terminated (0001) face of p-type $\alpha$ (6H)-SiC. This layer was created by implantation of Al ions on 600° C. substrates at dosage levels of $6\times10^{15}$/cm$^2$.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. An ohmic contact structure between platinum and silicon carbide, and that can withstand annealing while retaining ohmic characteristics, said ohmic contact structure comprising:

a portion of single crystal p-type silicon carbide;

a platinum contact on said single crystal silicon carbide portion; and a layer of doped p-type silicon carbide having a depletion region and being between said single crystal silicon carbide portion and said platinum contact, said doped layer having a sufficient concentration of p-type dopant to provide ohmic behavior between said silicon carbide portion and said platinum contact.

2. An ohmic contact structure according to claim 1 wherein said doped layer has a sufficient concentration of p-type dopant to reduce the width of the depletion region formed by said metal contact and said semiconductor enough to allow carrier tunneling transport across the interface between said metal contact and said semiconductor.

3. An ohmic contact structure according to claim 1 wherein said doped layer comprises an ion implanted region in said single crystal portion.

4. An ohmic contact structure according to claim 1 wherein said doped layer comprises an epitaxial layer.

5. An ohmic contact structure according to claim 1 wherein said single crystal portion of silicon carbide comprises an epitaxial layer.

6. An ohmic contact structure according to claim 1 wherein said doped p-type layer is doped with aluminum.

7. An ohmic contact structure according to claim 1 wherein said doped p-type layer is doped with boron.

8. An ohmic contact structure according to claim 1 wherein said doped p-type layer has a carrier concentration of at least $10^{17}$ cm$^{-3}$.

9. An ohmic contact structure according to claim 1 wherein said doped p-type layer has a carrier concentration of at least $5 \times 10^{18}$ cm$^{-3}$.

10. An ohmic contact structure according to claim 1 wherein said doped p-type layer has a carrier concentration of at least $10^{19}$ cm$^{-3}$.

11. An ohmic contact structure according to claim 1 and further comprising a platinum-silicide composition between said doped p-type layer and said platinum contact.

12. An ohmic contact structure according to claim 1 wherein said doped p-type layer has a thickness of about 100 angstroms.

13. An ohmic contact structure according to claim 1 wherein said silicon carbide comprises a 6H polytype.

14. An ohmic contact structure according to claim 1 wherein said silicon carbide is selected from the group consisting of the 3C, 2H, 4H, 6H, 8H and 15R polytypes.

* * * * *

UNITED STATES PATENT AND TRADEMARK OFFICE
CERTIFICATE OF CORRECTION

PATENT NO. : 5,323,022
DATED : June 21, 1994
INVENTOR(S) : Glass, et al.

It is certified that error appears in the above-indentified patent and that said Letters Patent is hereby corrected as shown below:

On the title page:

<u>UNDER "OTHER PUBLICATIONS"</u>:

On Page 2, Column 1, line 12, "SEmiconductor" should be -- Semiconductor --.

On Page 2, Column 1, line 14, "vol" should be -- vol. --.

On Page 2, Column 2, line 10, "res." should be -- Res. --.

Column 1, line 37, "page 304" should be -- pp. 294-297 --.

Column 5, lines 16-17, ""High Temperature Implantation of Silicon Carbide"" should be -- "Implantation and Electrical Activation of Dopants into Monocrystalline Silicon Carbide" --.

UNITED STATES PATENT AND TRADEMARK OFFICE
CERTIFICATE OF CORRECTION

PATENT NO. : 5,323,022
DATED : June 21, 1994
INVENTOR(S) : Glass et al.

It is certified that error appears in the above-identified patent and that said Letters Patent is hereby corrected as shown below:

Column 5, line 67, "$5 \times 10^{-3}$" should be -- $5 \times 10^{18} cm^{-3}$ --.

Column 6, line 27, "$5 \times 10^{-3}$" should be -- $5 \times 10^{21} cm^{-3}$ --.

Column 6, line 67, "$10^{15} cm^2$" should be -- $10^{15}/cm^2$ --.

Column 6, line 67, "$10^{16} cm^2$" should be -- $10^{16}/cm^2$ --.

Column 7, line 11, "n" should be -- in --.

Column 8, line 6, "difusional" should be -- diffusional --.

Signed and Sealed this

First Day of November, 1994

Attest:

Attesting Officer

BRUCE LEHMAN

Commissioner of Patents and Trademarks

UNITED STATES PATENT AND TRADEMARK OFFICE
CERTIFICATE OF CORRECTION

PATENT NO. : 5,323,022
DATED : June 21, 1994
INVENTOR(S) : Robert C. Glass et al.

It is certified that error appears in the above-identified patent and that said Letters Patent is hereby corrected as shown below:

Column 1,
Line 3, the following statement should appear as the first paragraph:
-- The U.S. Government has a paid-up license in this invention and the right in limited circumstances to require the patent owner to license others on reasonable terms as provided for by the terms of contract N00014-88-K-0341 awarded by the Office of Naval Research. --

Signed and Sealed this

Fifteenth Day of March, 2005

JON W. DUDAS
*Director of the United States Patent and Trademark Office*